(12) United States Patent
Wang et al.

(10) Patent No.: US 9,843,397 B2
(45) Date of Patent: Dec. 12, 2017

(54) WAVELENGTH STABILIZER FOR TWDM-PON BURST MODE DBR LASER

(71) Applicant: Futurewei Technologies, Inc., Plano, TX (US)

(72) Inventors: Feng Wang, Bedminster, NJ (US); Xuejin Yan, Santa Clara, CA (US); Bo Gao, Wuhan (CN); Frank Effenberger, Colts Neck, NJ (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 15/007,971

(22) Filed: Jan. 27, 2016

(65) Prior Publication Data
US 2016/0142151 A1   May 19, 2016

Related U.S. Application Data

(63) Continuation of application No. 14/514,080, filed on Oct. 14, 2014, now Pat. No. 9,281,899.
(Continued)

(51) Int. Cl.
*H04B 10/564* (2013.01)
*H04J 14/02* (2006.01)
(Continued)

(52) U.S. Cl.
CPC ....... *H04B 10/572* (2013.01); *H01S 5/02415* (2013.01); *H01S 5/06256* (2013.01);
(Continued)

(58) Field of Classification Search
USPC .................................... 398/81, 193, 43, 196
See application file for complete search history.

(56) References Cited

U.S. PATENT DOCUMENTS

| 3,944,947 A | * | 3/1976 | Pike ...................... H01S 3/2383 |
| | | | 359/345 |
| 4,993,032 A | * | 2/1991 | Bradley ............. G02B 6/12004 |
| | | | 372/20 |

(Continued)

FOREIGN PATENT DOCUMENTS

EP    1617532 A1    1/2006

OTHER PUBLICATIONS

Darvish, et al., "Precompensation Techniques to Suppress the Thermally Induced Wavelength Drift in Tunable DBR Lasers," IEEE Journal of Quantum Electronics, vol. 44, No. 10, Oct. 2008, pp. 958-965.

(Continued)

*Primary Examiner* — Oommen Jacob
(74) *Attorney, Agent, or Firm* — Conley Rose, P.C.

(57) ABSTRACT

An optical network unit (ONU) comprising a media access controller (MAC) configured to support biasing a laser transmitter to compensate for temperature related wavelength drift receiving a transmission timing instruction from an optical network control node, obtaining transmission power information for the laser transmitter, estimating a burst mode time period for the laser transmitter according to the transmission timing instruction, and calculating a laser phase fine tuning compensation value for the laser transmitter according to the burst mode time period and the transmission power information, and forwarding the laser phase fine tuning compensation value toward a bias controller to support biasing a phase of the laser transmitter.

22 Claims, 7 Drawing Sheets

Related U.S. Application Data

(60) Provisional application No. 61/890,689, filed on Oct. 14, 2013.

(51) Int. Cl.
| | |
|---|---|
| *H04B 10/50* | (2013.01) |
| *H01S 5/0625* | (2006.01) |
| *H04B 10/572* | (2013.01) |
| *H01S 5/024* | (2006.01) |
| *H01S 5/068* | (2006.01) |
| *H04B 10/079* | (2013.01) |
| *H01S 5/022* | (2006.01) |
| *H01S 5/062* | (2006.01) |
| *H01S 5/0687* | (2006.01) |

(52) U.S. Cl.
CPC ... *H01S 5/06804* (2013.01); *H04B 10/07955* (2013.01); *H04B 10/503* (2013.01); *H04B 10/50575* (2013.01); *H04B 10/564* (2013.01); *H04J 14/0221* (2013.01); *H04J 14/0223* (2013.01); *H04J 14/0278* (2013.01); *H04J 14/0282* (2013.01); *H01S 5/02284* (2013.01); *H01S 5/0687* (2013.01); *H01S 5/06216* (2013.01)

(56) References Cited

U.S. PATENT DOCUMENTS

| | | | |
|---|---|---|---|
| 5,642,371 A | 6/1997 | Tohyama et al. | |
| 6,233,263 B1* | 5/2001 | Chang-Hasnain | H01S 5/0264 372/20 |
| 6,526,079 B1* | 2/2003 | Watterson | H01S 5/0687 372/20 |
| 6,788,719 B2* | 9/2004 | Crowder | B82Y 20/00 372/29.015 |
| 6,807,205 B1* | 10/2004 | Albrecht | H01S 3/225 372/20 |
| 8,649,681 B2* | 2/2014 | Ohlen | H04J 14/0282 398/156 |
| 2003/0177502 A1* | 9/2003 | Kolze | H04N 21/6118 725/111 |
| 2007/0025230 A1* | 2/2007 | Chang | G11B 7/126 369/116 |
| 2008/0089373 A1* | 4/2008 | Bhatia | H04N 9/3129 372/38.02 |
| 2009/0059972 A1 | 3/2009 | Farrell | |
| 2009/0129414 A1* | 5/2009 | Gollier | H04N 9/3158 372/20 |
| 2009/0174931 A1* | 7/2009 | Huber | H01S 3/06791 359/340 |
| 2009/0175303 A1 | 7/2009 | Zhang et al. | |
| 2009/0252187 A1* | 10/2009 | Bauco | H01S 5/06255 372/29.011 |
| 2010/0098116 A1* | 4/2010 | Bhatia | H01S 5/06256 372/10 |
| 2010/0104286 A1* | 4/2010 | Okuno | H04L 43/0864 398/66 |
| 2010/0150190 A1* | 6/2010 | Masood | H01S 5/0612 372/29.023 |
| 2011/0134947 A1* | 6/2011 | Rahum | H01S 3/09415 372/29.015 |
| 2013/0094854 A1* | 4/2013 | Yan | H01S 5/06256 398/38 |
| 2014/0233944 A1* | 8/2014 | Vetter | H04J 14/0282 398/34 |
| 2015/0063812 A1* | 3/2015 | Dove | H04Q 11/0067 398/67 |
| 2015/0104179 A1* | 4/2015 | Wang | H04B 10/564 398/81 |
| 2015/0303650 A1* | 10/2015 | Houtsma | H01S 5/06258 372/38.02 |
| 2015/0318930 A1* | 11/2015 | Grobe | H04B 17/11 398/79 |
| 2015/0381300 A1* | 12/2015 | Roberts | H04B 10/07955 398/68 |

OTHER PUBLICATIONS

Foreign Communication From a Counterpart Application, PCT Application No. PCT/US2014/060488, International Search Report dated Apr. 8, 2015, 7 pages.

Foreign Communication From a Counterpart Application, PCT Application No. PCT/US2014/060488, Written Opinion dated Apr. 8, 2015, 10 pages.

Notice of Allowance dated Dec. 22, 2015, 16 pages, U.S. Appl. No. 14/514,080, filed Oct. 14, 2014.

* cited by examiner

US 9,843,397 B2

WAVELENGTH STABILIZER FOR TWDM-PON BURST MODE DBR LASER

CROSS-REFERENCE TO RELATED APPLICATIONS

The present application is a continuation of U.S. patent application Ser. No. 14/514,080, filed Oct. 14, 2014 by Feng Wang et al., and entitled "Wavelength Stabilizer For TWDM-PON Burst Mode DBR Laser," which claims priority to U.S. Provisional Patent Application 61/890,689, filed on Oct. 14, 2013 by Feng Wang et al., and entitled "Wavelength Stabilizer For TWDM-PON Burst Mode DBR Laser," which is incorporated herein by reference as if reproduced in their entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Time and wavelength division multiplexing (TWDM) passive optical network (PON) systems are multi-wavelength systems for upstream and downstream direction communications. Different channels are transmitted by a laser diode, typically in an optical network unit (ONU), via optical connections (e.g., optical fibers) to a destination receiver. A de-multiplexer at a central office separates upstream wavelengths into different channels.

SUMMARY

In one embodiment, the disclosure includes an ONU comprising a media access controller (MAC) configured to support biasing a laser transmitter to compensate for temperature related wavelength drift receiving a transmission timing instruction from an optical network control node, obtaining transmission power information for the laser transmitter, estimating a burst mode time period for the laser transmitter according to the transmission timing instruction, and calculating a laser phase fine tuning compensation value for the laser transmitter according to the burst mode time period and the transmission power information, and forwarding the laser phase fine tuning compensation value toward a bias controller to support biasing a phase of the laser transmitter.

In another embodiment, the disclosure includes a method of biasing a phase of a laser transmitter to compensate for temperature related wavelength drift implemented in an optical device, wherein the method comprises receiving a transmission timing instruction from an optical line terminal (OLT), wherein the transmission timing instruction indicates a timeslot for an upstream transmission by the laser transmitter, estimating a laser transmitter burst mode time period based on the timeslot calculating transmission power information based on a measurement of current associated with the laser transmitter, calculating an amount of injection current to be used for biasing the phase of the laser transmitter phase based on the calculated transmission power information and the estimated burst mode time period, and biasing the laser transmitter to compensate for temperature related wavelength drift by injecting the calculated injection current into an input of a Distributed Bragg Reflector (DBR) laser gain section of the laser transmitter concurrently with data input.

In yet another embodiment, the disclosure includes a method implemented in a PON comprising transmitting an optical signal in the PON via a laser transmitter utilizing TWDM, and compensating for a red-shift in a wavelength of the optical signal associated with an increase in temperature of the laser transmitter associated with a duration of an optical signal burst, wherein compensation is performed by introducing a blue-shift wavelength bias to the DBR laser gain section of the laser transmitter.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Disclosed herein is a transmitter that is wavelength insensitive to burst length and is employed in an ONU in a TWDM-PON. The transmitter compensates for wavelength drift caused by temperature shifts associated with varying burst lengths in a DBR laser. The ONU compensates for wavelength drift by employing a media access controller block to provide laser phase fine tuning current value according to a control algorithm. A tuning current is generated according to the laser phase fine tuning current value and is used to stabilize the laser wavelength. The transmitter is employed to provide wavelength stabilization to support real-time bandwidth assignment and traffic management, and is capable of dynamic upstream transmission stabilization.

Figure 1:
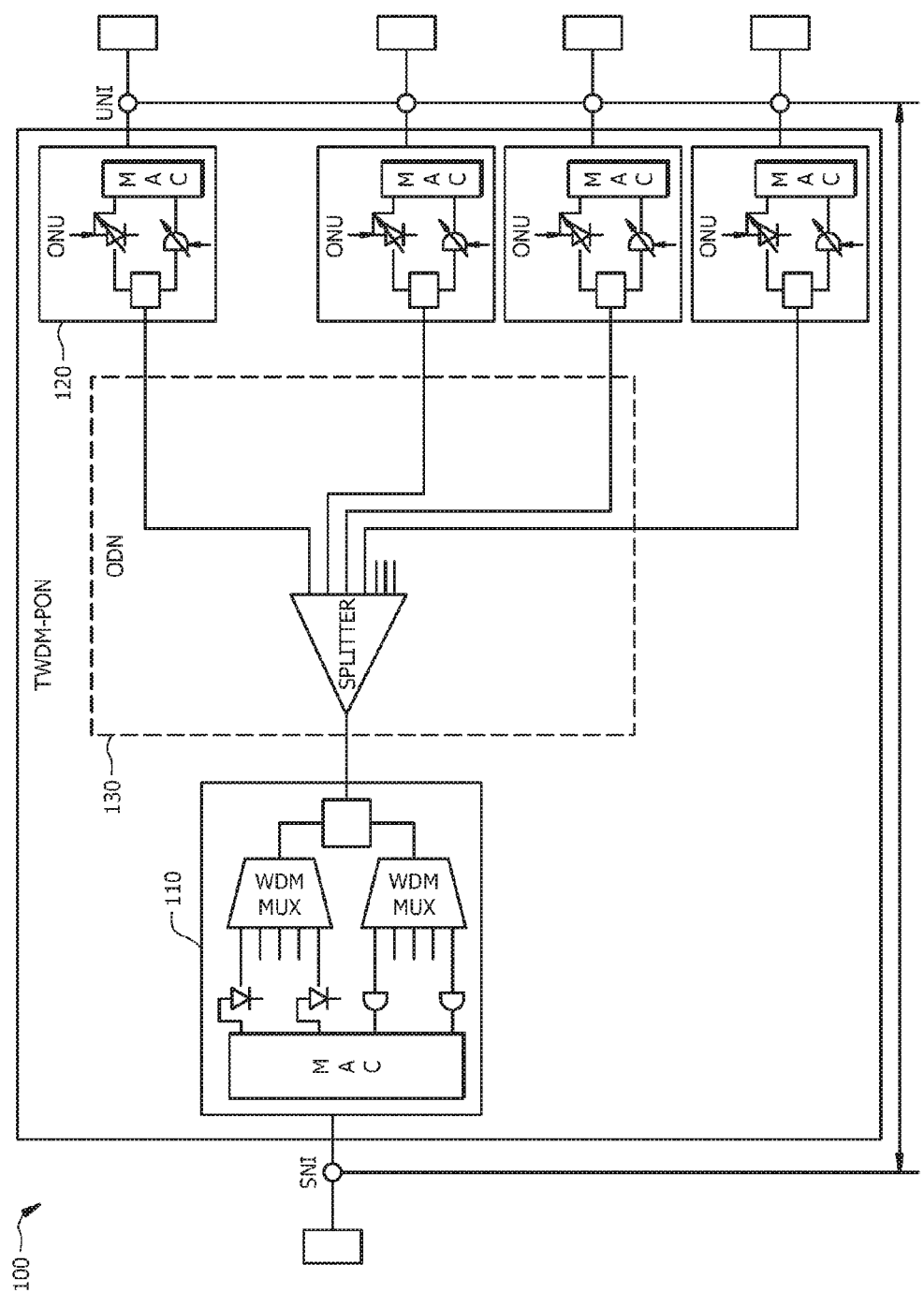
FIG. 1 is a schematic diagram of an embodiment of a PON.

FIG. 1 is a schematic diagram of an embodiment of a PON 100. The PON 100 comprises an OLT 110, a plurality of ONUs 120; and an ODN 130, which may be coupled to the OLT 110 and the ONUs 120. The PON 100 comprises a communications network that does not require any active components to distribute data between the OLT 110 and the ONUs 120. Instead, the PON 100 uses passive optical components in the ODN 130 to distribute data between the OLT 110 and the ONUs 120. In one embodiment, the PON 100 comprises a Next Generation Access (NGA) system, such as a ten Gbps Gigabit PON (XGPON), which has a downstream bandwidth of about ten Gbps and an upstream bandwidth of at least about 2.5 Gbps. Alternatively, in another embodiment, the PON 100 comprises any Ethernet based network, such as an Ethernet Passive Optical Network (EPON) defined by the Institute of Electrical and Electronics Engineers (IEEE) 802.3ah standard, a 10 Gigabit EPON as defined by the IEEE 802.3av standard, an asynchronous transfer mode PON (APON), a broadband PON (BPON) defined by the International Telecommunication Union (ITU) Telecommunication Standardization Sector (ITU-T) G.983 standard, a Gigabit PON (GPON) defined by the ITU-T G.984 standard, a wavelength division multiplexed (WDM) PON (WPON), or a suitable after-arising technology, all of which are incorporated herein by reference as if reproduced in their entirety.

In an embodiment, the OLT 110 comprises any devices configured to communicate with the ONUs 120 and another network (not shown). Specifically, the OLT 110 acts as an intermediary between the other network and the ONUs 120. For instance, the OLT 110 forwards data received from the network to the ONUs 120, and forwards data received from the ONUs 120 onto the other network via a system network interface (SNI). Although the specific configuration of the OLT 110 may vary depending on the type of PON 100, in one embodiment, the OLT 110 comprises a transmitter and a receiver, a wavelength division multiplexing multiplexer (WDM MUX) for multiplexing signals over a plurality of wavelengths, and a media access controller (MAC) for controlling packet encoding/decoding on an optical signal. When the other network uses a network protocol, such as Ethernet or Synchronous Optical Networking/Synchronous Digital Hierarchy (SONET/SDH), which differs from the PON protocol used in the PON 100, the OLT 110 further comprises a converter that converts the network protocol into the PON protocol. The OLT 110 converter also converts the PON protocol into the network protocol. The OLT 110 is typically located at a central location, such as a central office, but may be located at other locations as well in alternative embodiments.

In an embodiment, the ONUs 120 comprise any devices that are configured to communicate with the OLT 110 and a customer or user via a user network interface (UNI). Specifically, the ONUs 120 acts as an intermediary between the OLT 110 and the customer. For instance, the ONUs 120 forwards data received from the OLT 110 to the customer and forwards data received from the customer onto the OLTs 110. Although the specific configuration of the ONUs 120 may vary depending on the type of PON 100, in one embodiment, the ONUs 120 comprise an optical transmitter configured to send optical signals to the OLT 110, an optical receiver configured to receive optical signals from the OLT 110, and a MAC for controlling packet encoding/decoding. In some embodiments, the optical signals are sent in a burst mode. In embodiments in which a plurality optical signals sharing a common wavelength are to be sent, the optical signals employ a common transmission channel. Additionally, the ONUs 120 further comprise a converter that converts the optical signal into electrical signals for the customer, such as signals in the Ethernet or asynchronous transfer mode (ATM) protocol, and a second transmitter and/or receiver that sends and/or receives the electrical signals to and/or from a customer device. In some embodiments, ONUs 120 and optical network terminals (ONTs) are similar, and thus the terms are used interchangeably herein. The ONUs 120 is typically located at distributed locations, such as the customer premises, but may be located at other locations as well in alternative embodiments.

In an embodiment, the ODN 130 comprises a data distribution system, which comprises optical fiber cables, couplers, splitters, distributors, and/or other equipment. In an embodiment, the optical fiber cables, couplers, splitters, distributors, and/or other equipment comprise passive optical components. Specifically, the optical fiber cables, couplers, splitters, distributors, and/or other equipment are components that do not require any power to distribute data signals between the OLT 110 and the ONUs 120. Alternatively, in another embodiment, the ODN 130 comprises one or a plurality of active components, such as optical amplifiers. The ODN 130 typically extends from the OLTs 110 to the ONUs 120 in a branching configuration as shown in FIG. 1, but in alternative embodiments may be alternatively configured in any other point-to-multi-point configuration.

Figure 2:
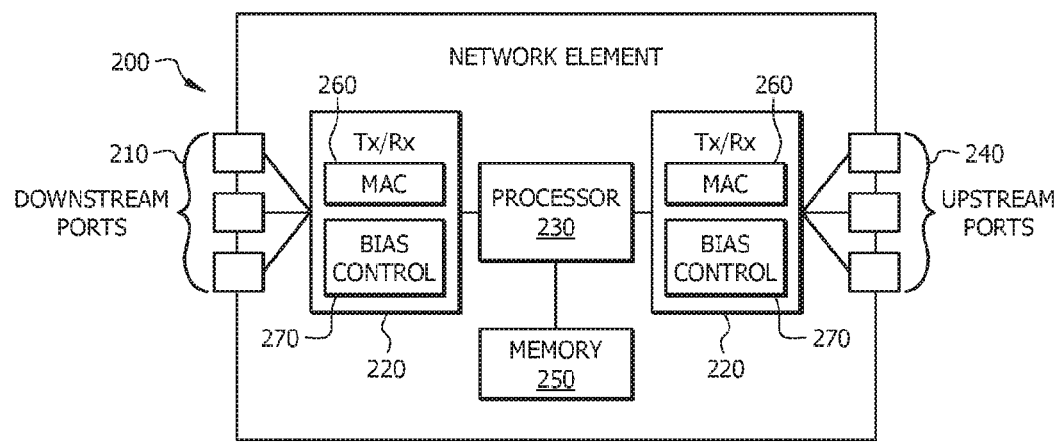
FIG. 2 is a schematic diagram of an embodiment of a network element.

At least some of the features/methods described in this disclosure are implemented in a network element. For instance, the features/methods of this disclosure may be implemented using hardware, firmware, and/or software installed to run on hardware. FIG. 2 is a schematic diagram of an embodiment of a network element 200 that may act as an ONU 120 and/or OLT 110, each shown in FIG. 1. The network element 200 is any device (e.g., an access point, an access point station, a router, a switch, a gateway, a bridge, a server, a client, a user-equipment, a mobile communications device, ONU, ONT, OLT, etc.) that transports and/or facilitates transmission of data through a network, system, and/or domain.

The network element 200 comprises one or more downstream ports 210 coupled to a transceiver (Tx/Rx) 220, which comprise transmitters, receivers, or combinations thereof. The Tx/Rx 220 transmits and/or receives frames from other network nodes via the downstream ports 210. Similarly, the network element 200 comprises another Tx/Rx 220 coupled to a plurality of upstream ports 240, wherein the Tx/Rx 220 transmits and/or receives frames from other nodes via the upstream ports 240. The downstream ports 210 and/or the upstream ports 240 include electrical and/or optical transmitting and/or receiving components. Further, not all of the downstream ports 210 and/or the upstream ports 240 need be the same type in some embodiments (e.g. some electrical ports, some optical ports, etc.). In another embodiment, the Tx/Rx 220 comprises one or more laser diodes, such as a Transmitter Optical Sub-Assembly (TOSA), one or more photoreceptors, such as a Receiver Optical Sub-Assembly (ROSA), or combinations thereof. In some embodiments, the laser diodes are DBR laser diodes in a TWDM-PON architecture. The Tx/Rx 220 may also transmit and/or receive data (e.g., packets) from other network elements via wired or wireless connections, depending on the embodiment.

In some embodiments, the Tx/Rx 220 comprise a MAC module 260. The MAC module 260 is implemented via execution by processor 230, memory 250, Tx/Rx 220, and/or combinations thereof. In one embodiment, the MAC module 260 is implemented according to embodiments of the present disclosure to determine a tuning current and/or compensation current value for a laser diode coupled directly or indirectly to MAC module 260. In some embodiments the Tx/Rx 220 further comprise a bias control module 270. The bias control module 270 is implemented via execution by processor 230, memory 250, Tx/Rx 220, and/or combinations thereof. In one embodiment, the bias control module 270 is implemented to provide a laser diode with a tuning current and/or compensation current according to a value determined by MAC module 260. The bias control module 270 and/or MAC module 260 may be employed to implement methods 500 and 600, as discussed herein below, as well as any other methods disclosed herein. In some embodiments, MAC module 260 and bias control module 270 are stored in memory 250 and are accessed and/or executed via instructions from processor 230 and/or Tx/Rx 220.

A processor 230 is coupled to the Tx/Rx 220 and is configured to process the frames and/or determine to which nodes to send (e.g., transmit) the packets. In an embodiment, the processor 230 comprises one or more multi-core processors and/or memory modules 250, which function as data stores, buffers, etc. The processor 230 is implemented as a general processor or as part of one or more application specific integrated circuits (ASICs), field-programmable gate arrays (FPGAs), and/or digital signal processors (DSPs). Although illustrated as a single processor, the processor 230 is not so limited and may comprise multiple processors. The processor 230 is configured to communicate and/or process multi-destination frames.

FIG. 2 illustrates that a memory module 250 is coupled to the processor 230 and is a non-transitory medium configured to store various types of data and/or instructions. Memory module 250 comprises memory devices including secondary storage, read-only memory (ROM), and random-access memory (RAM). The secondary storage is typically comprised of one or more disk drives, optical drives, solid-state drives (SSDs), and/or tape drives and is used for non-volatile storage of data and as an over-flow storage device if the RAM is not large enough to hold all working data. The secondary storage is used to store programs which are loaded into the RAM when such programs are selected for execution. The ROM is used to store instructions and perhaps data that are read during program execution. The ROM is a non-volatile memory device which typically has a small memory capacity relative to the larger memory capacity of the secondary storage. The RAM is used to store volatile data and perhaps to store instructions. Access to both the ROM and RAM is typically faster than to the secondary storage.

It is understood that by programming and/or loading executable instructions onto the network element 200, at least one of the processor 230, the cache, and the long-term storage are changed, transforming the network element 200 in part into a particular machine or apparatus, for example, a multi-core forwarding architecture having the novel functionality taught by the present disclosure. It is fundamental to the electrical engineering and software engineering arts that functionality that can be implemented by loading executable software into a computer can be converted to a hardware implementation by well-known design rules known in the art. Decisions between implementing a concept in software versus hardware typically hinge on considerations of stability of the design and number of units to be produced rather than any issues involved in translating from the software domain to the hardware domain. Generally, a design that is still subject to frequent change may be preferred to be implemented in software, because re-spinning a hardware implementation is more expensive than re-spinning a software design. Generally, a design that is stable and will be produced in large volume may be preferred to be implemented in hardware (e.g., in an ASIC) because for large production runs the hardware implementation may be less expensive than software implementations. Often a design may be developed and tested in a software form and then later transformed, by well-known design rules known in the art, to an equivalent hardware implementation in an ASIC that hardwires the instructions of the software. In the same manner as a machine controlled by a new ASIC is a particular machine or apparatus, likewise a computer that has been programmed and/or loaded with executable instructions may be viewed as a particular machine or apparatus.

Any processing of the present disclosure may be implemented by causing a processor (e.g., a general purpose multi-core processor) to execute a computer program. In this case, a computer program product can be provided to a computer or a network device using any type of non-transitory computer readable media. The computer program product may be stored in a non-transitory computer readable medium in the computer or the network device. Non-transitory computer readable media include any type of tangible storage media. Examples of non-transitory computer readable media include magnetic storage media (such as floppy disks, magnetic tapes, hard disk drives, etc.), optical magnetic storage media (e.g., magneto-optical disks), compact disc read-only memory (CD-ROM), compact disc recordable (CD-R), compact disc rewritable (CD-R/W), digital versatile disc (DVD), Blu-ray (registered trademark) disc (BD), and semiconductor memories (such as mask ROM, programmable ROM (PROM), erasable PROM, flash ROM, and RAM). The computer program product may also be provided to a computer or a network device using any type of transitory computer readable media. Examples of transitory computer readable media include electric signals, optical signals, and electromagnetic waves. Transitory computer readable media can provide the program to a computer via a wired communication line (e.g., electric wires, and/or optical fibers) and/or a wireless communication line.

Figure 3:
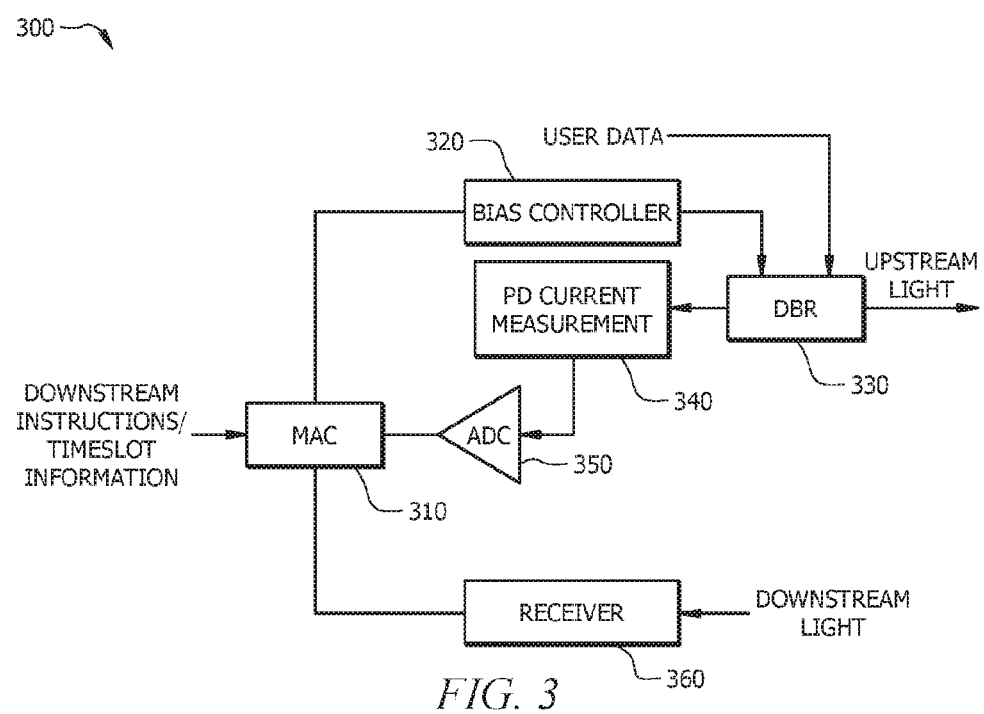
FIG. 3 is a schematic diagram of an embodiment of an ONU.

FIG. 3 is a schematic diagram of an embodiment of an ONU 300, which may be substantially similar to ONUs 120 and/or implemented in network element 200, for example in Tx/Rx 220. In alternative embodiments of ONU 300, the ONU 300 may be an optical network terminal (ONT). ONU 300 comprises a receiver 360, a media access controller (MAC) 310, bias controller 320, DBR laser 330, photodiode (PD) 340, and analog to digital converter (ADC) 350. ONU 300 is configured to compensate for wavelength shift in DBR laser 330 to minimize deviation from DBR laser 330's central peak wavelength. In some embodiments, ONU 300 compensating for the wavelength shift is known as introducing a blue-shift.

PD 340 is a detector configured to couple to DBR laser 330 and capture and/or measure a portion of the transmission power of DBR laser 330 as an analog value. After capturing and/or measuring a portion of the transmission power of DBR laser 330, PD 340 forwards the analog transmission power information to ADC 350. After receiving the analog transmission power information from PD 340, ADC 350 converts the analog transmission power information to a digital value and transmits the digital transmission power information to MAC 310.

Receiver 360 may receive downstream timeslot information from a source (e.g., an OLT, such as OLT 110). The receiver 360 forwards the downstream timeslot information and/or instructions to a processor (e.g. processor 230), a storage device (e.g. memory module 250), and/or the MAC 310. The MAC 310 estimates a burst mode time period of ONU 300 based on the downstream timeslot information/instructions and/or based on user data for upstream communication (e.g. received from a user, processor, storages device, etc.). The burst mode time period indicates a period of time that corresponds to an output transmission of DBR laser 330. In some embodiments the timeslot information and/or instructions are received from an OLT, such as OLT 110, shown in FIG. 1. It should be noted that some or all of the timeslot information and/or instructions may be received from other components in the ONU 300 (e.g. configured based on user initiated communications and known timeslot information from an OLT). According to the estimated burst mode time period, as well as digital transmission power information received from ADC 350, MAC 310 determines a laser phase fine tuning current value for DBR laser 330. In some embodiments, the laser phase fine tuning current value is a time dependent function such that it is defined by $I_p = f(t)$, where $I_p$ is the phase current and t represents time and ranges from 0 to the end of the burst mode time period. After determining the laser phase fine tuning current value, MAC 310 transmits the value to bias controller 320 to enable the injection of the laser phase fine tuning current into DBR laser 330 to compensate for wavelength shift associated with burst mode temperature shifts when DBR laser 330 is enabled, thereby causing the output of DBR 330 to experience a net wavelength shift of about zero.

Bias controller 320 comprises an electronic control circuit configured to provide DBR laser 330 with the laser phase fine tuning current. The laser phase fine tuning current is utilized to force a blue-shift in DBR laser 330 to compensate for a temperature associated red-shift in upstream transmissions from DBR laser 330. Bias controller 320 determines the laser phase fine tuning current according to the laser phase fine tuning value received from MAC 310.

DBR laser 330 is configured to receive digital user data from a downstream source (e.g., a client device) and transmit the digital data to an upstream destination (e.g., an OLT). In some embodiments, the digital data received by DBR laser 330 is represented by an electrical current. To transmit the digital data to the upstream source, DBR laser 330 converts the digital data into optical data (e.g., light). In some embodiments, DBR laser 330 combines a tuning current (e.g., the laser fine tuning current) received from a controller (e.g., bias controller 320) with the optical data to form an output transmission of DBR laser 330. In some embodiments of ONU 300, upstream wavelength stabilization is employed to automatically adjust the working wavelength of a transmission module (e.g., a laser such as DBR laser 330) to match the grid wavelength of a de-multiplexer in an associated OLT.

Figure 4:
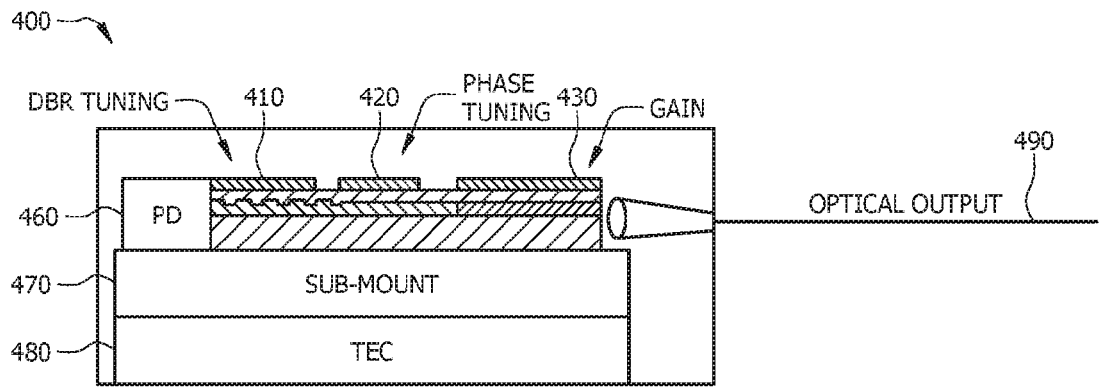
FIG. 4 is a schematic diagram of a DBR laser.

FIG. 4 is a schematic diagram of a DBR laser 400, which may be substantially similar to DBR laser 330. DBR laser 400 comprises a DBR tuning section 410, a phase tuning section 420, a gain section 430, a photodiode (PD) 460, a sub-mount 470, a thermoelectrically cooling (TEC) module 480, and an optical output 490. DBR laser gain section 430 aggregates an Radio Frequency (RF) input and a bias input to generate a total input signal that is encoded onto an optical signal for transmission to an upstream destination by DBR laser 400. The RF input comprises user data received by DBR laser 400 for sending to an upstream destination via an optical signal, which in some embodiments may be a burst mode transmission. The bias input is used to introduce a compensation value to the output of DBR laser 400, for example a blue-shift wavelength compensation for a corresponding red-shift experienced by DBR laser 400 as a result of temperature increases, as is discussed below in greater detail. In some embodiments of DBR laser 400 phase tuning section 420 controls and/or manipulates a phase of the optical signal and may also be used to compensate for red-shift cause by burst mode operation. Gain section 430 controls a transmission strength of the optical signal generated by DBR laser 400 by increasing an amount of power of the optical signal for transmission. In some embodiments of a DBR laser 400, a plurality of output facets are provided. In some embodiments, current is applied to DBR tuning section 410 to perform wide range wavelength tuning. A first output facet is coupled to an optical fiber for transmitting optical signals to an upstream and/or downstream destination. A second output facet is coupled to PD 460. In embodiments of DBR laser 400 that employ PD 460, the PD 460 comprises a detector that detects and/or measures the output power of the laser transmitter in order to monitor optical signals generated by DBR laser 400. The DBR laser is mounted to TEC module 480 via sub-mount 470, which acts as a structural component and/or heat sink. TEC module 480 is configured to perform cooling operations for DBR laser 400 by acting as a solid state heat pump to further reduce temperature related wavelength drift.

When DBR laser 400 performs a burst mode transmission, the wavelength of the associated tunable laser shifts due to temperature drift during the burst mode transmission. As used herein, an increase in wavelength may be referred to as a red-shift and a decrease in wavelength may be referred to as a blue-shift. The shift in upstream wavelength results in performance degradation in the system because, for a multi-wavelength TWDM-PON system (e.g., architecture 100, shown in FIG. 1), the de-multiplexer (e.g., at OLT 110, shown in FIG. 1) is employed to separate upstream wavelengths into their respective receiving channels at a central office. Deviation from the central peak wavelength for a transmission increases the power requirements for compensation at the de-multiplexer.

Figure 5:
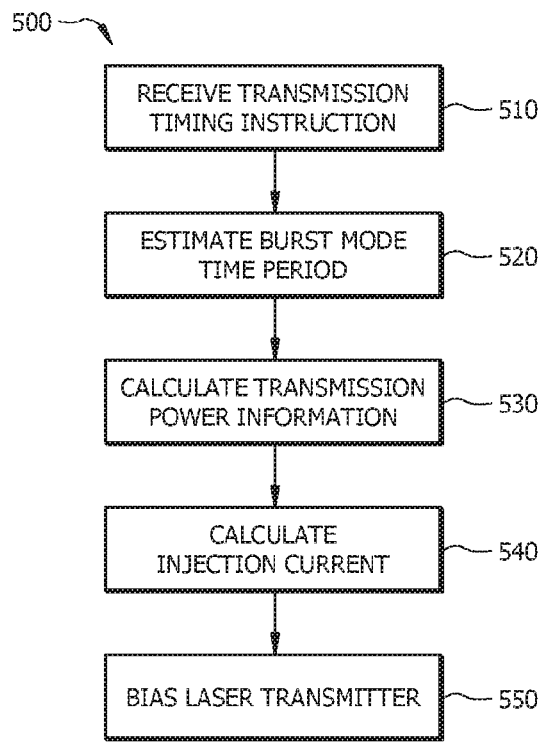
FIG. 5 is a flowchart of an embodiment of a method of biasing a phase of a laser transmitter.

FIG. 5 is a flowchart of an embodiment of a method 500 of biasing a phase of a laser transmitter (e.g., a DBR, such as DRB laser 330, shown in FIG. 3). In some embodiments, method 500 is implemented in an ONU, such as ONU 300 and/or network element 200. At step 510, a transmission timing instruction is received from a source. The transmission timing instruction indicates a timeslot for upstream optical signal transmissions from the laser transmitter. In some embodiments, the transmission timing instruction is received by a MAC, such as MAC 310, shown in FIG. 3. At step 520, a burst mode time period for the laser transmitter is estimated based on the received transmission timing information. In some embodiments, the estimation of the burst mode time period is determined by the MAC. At step 530, transmission power information for the laser transmitter is calculated based on a measurement of current associated with the laser transmitter. In some embodiments, the MAC performs the calculation of the transmission power information based on a digital current value received via measurement by a photodiode. At step 540, an amount of injection current for biasing the laser transmitter is determined based on the estimated burst mode time period and calculated transmission power information. In some embodiments, the amount of injection current is determined by the MAC. The amount of injection current is in some embodiments referred to as a blue-shift and/or a compensation current. At step 550, a DBR gain section of the laser transmitter is biased with the injection current to compensate for wavelength drift in the laser transmitter output that is caused by an increase in temperature associated with the laser transmitter. In some embodiments, the laser transmitter is biased by a bias controller, such as bias controller 320 according to instructions (e.g., the injection current determined in step 540) received from the MAC.

Figure 6:
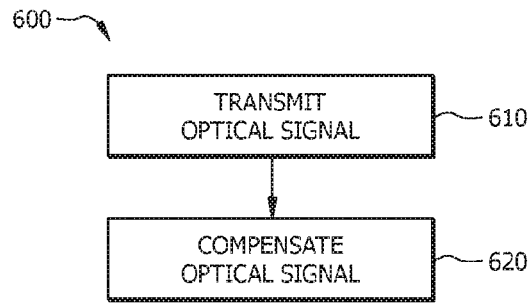
FIG. 6 is a flowchart of an embodiment of a method for transmitting a blue-shift compensated optical signal in a PON.

FIG. 6 is a flowchart of an embodiment of a method 600 for transmitting a blue-shift compensated optical signal in a PON such as PON 100, shown in FIG. 1. In some embodiments, method 600 is implemented by an ONU, such as ONU 400 and/or network element 200. At step 610, an optical signal is transmitted via a laser transmitter, such as DBR laser 330, shown in FIG. 3. At step 620, the transmission of step 610 is dynamically compensated to adjust for a red-shift in the transmission wavelength. In some embodiments, the red-shift in the transmission wavelength is associated with a duration of an optical signal burst from the laser transmitter. To compensate for the red-shift in the transmission wavelength, a blue-shift bias is introduced to a DBR laser gain section of the laser transmitter.

Figure 7:
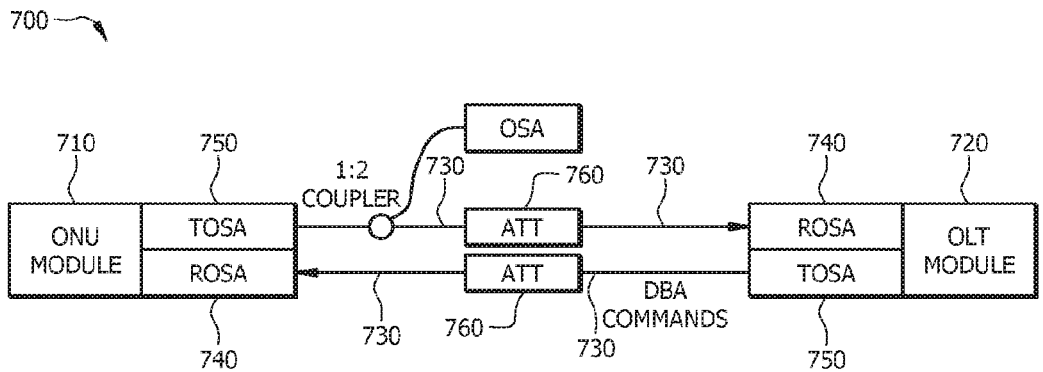
FIG. 7 is a schematic diagram of a TWDM-PON architecture.

FIG. 7 is a schematic diagram of a TWDM-PON architecture 700 which can be used to implement a network such as PON 100, shown in FIG. 1. Architecture 700 comprises an ONU 710, which may be substantially similar to ONU 120, shown in FIG. 1, coupled to an OLT 720, which may be substantially similar to OLT 110, shown in FIG. 1, via one or more optical connections 730 that utilize optical fibers. In some embodiments, ONU 710 and OLT 720 each comprise a ROSA 740 for receiving optical transmissions, a TOSA 750 for transmitting optical signals, an optical splitter assembly (OSA) for splitting/combining optical signals (e.g. a 1:2 coupler), as well as attenuators 760. In other embodiments, ONU 710 further comprises a miniature device (XMD) TOSA package tunable laser. Architecture 700 is used to determine laser (e.g., a Thermoelectrically cooled (TEC) laser and/or a DBR laser) wavelength drift. TEC lasers experience wavelength drift, as discussed above with respect to FIG. 4, due to changes in the laser diode that occur as a result of heat. During burst mode transmissions, the temperature of the TEC laser chip increases in a short period of time, resulting in the wavelength drift.

Figure 8:
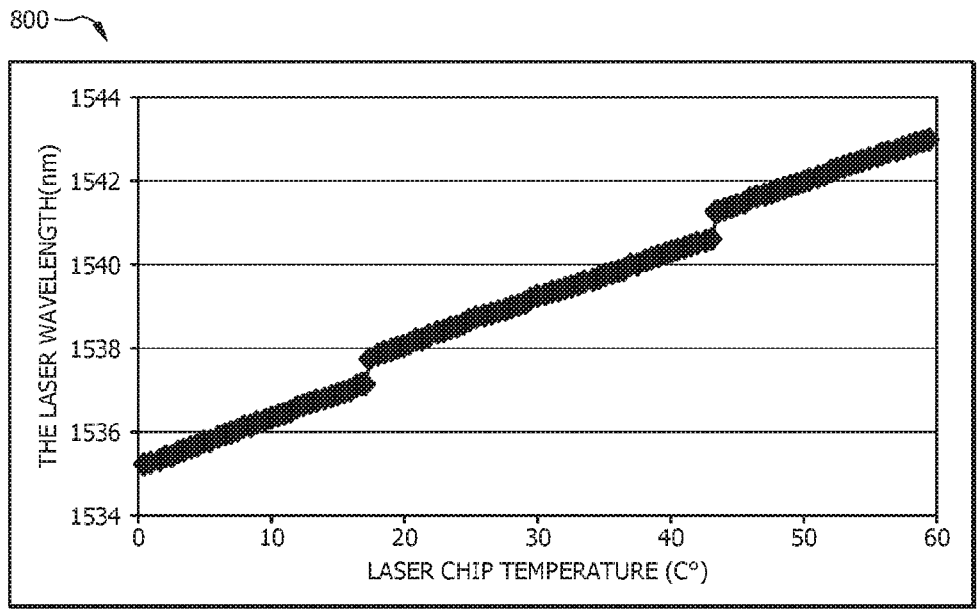
FIG. 8 is a graph of data relating laser transmission wavelength in nanometers (nm) and laser diode temperature in degrees Celsius (C.°).

FIG. 8 is a graph 800 of data relating laser transmission wavelength in nanometers (nm) and laser diode temperature in C.°. The data of FIG. 8 is obtainable as results from an embodiment of architecture 700. As shown in FIG. 8, the transmission wavelength of an uncompensated DBR laser shifts as temperature increases. Specifically, over the range of 0 C.° to 60 C.°, the laser wavelength experiences a red-shift of about 8 nm. In some embodiments, the wavelength hops several times within a temperature range of 0 C.° to 60 C.°. A DBR laser operating in burst mode experiences hopping when the laser mode shift rate caused by temperature change is different from an associated DBR reflection spectral profile shift rate.

Figure 9:
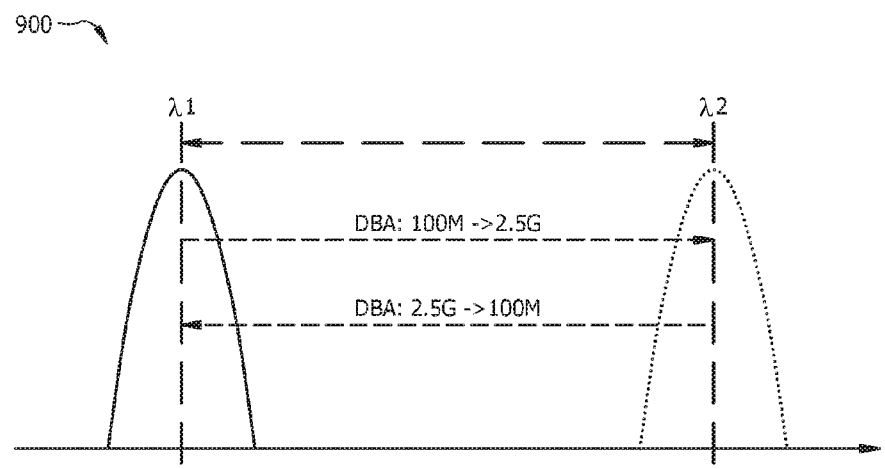
FIG. 9 is a graph of data associated with an embodiment of a TWDM-PON ONU transmitter architecture.

FIG. 9 is a graph 900 of data associated with an embodiment of a TWDM-PON ONU transmitter architecture, such as architecture 700, shown in FIG. 7. When a TEC is set to about 45 C.° and the ONU bandwidth is held at 100 Megabits per second (Mbps), the wavelength remains at about wavelength unit ($\lambda 1$). When the bandwidth increases from 100 Mbps to 2.5 Gigabits per second (Gbps) (e.g. full bandwidth), the wavelength shifts to about a second wavelength unit ($\lambda 2$). The shifting time occurs in about 1 second (s). When the wavelength shifts from $\lambda 1$ to $\lambda 2$, the wavelength deviates from its ideal peak value and results in loss causing a reduced power budget for the architecture.

Figure 10:
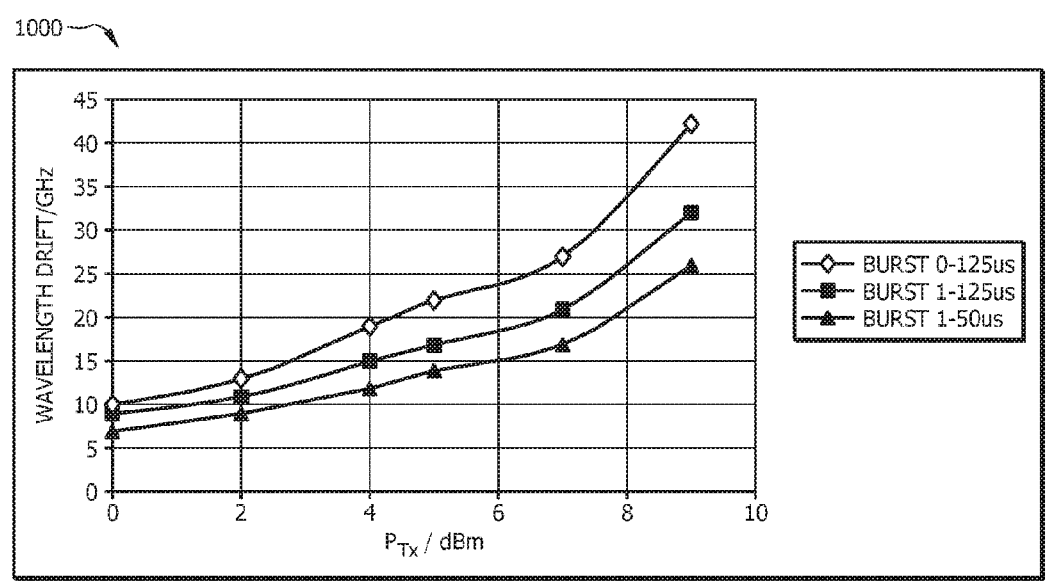
FIG. 10 is a graph of wavelength shift versus optical power transmission power for various burst mode time periods for an embodiment of an uncompensated ONU transmitter.

FIG. 10 is a graph 1000 of wavelength shift in gigahertz (GHz) versus optical transmission power ($P_{tx}$) in Decibel-milliwatts (dBm) for various burst mode time periods in microseconds (μs) for an embodiment of an uncompensated ONU transmitter, such as ONU 120, shown in FIG. 1, operating in a PON, such as PON 100, shown in FIG. 1. When an ONU transmits in burst mode, a red-shift is observed in the resulting transmission. As burst mode time periods increase, laser diode temperature increases accordingly. As shown in graph 1000, the red-shift is reduced when transmission power and/or the burst mode time period are reduced. In some embodiments, a reduction in transmission power corresponds to a reduction in the optical power budget of upstream transmissions from the ONU. In other embodiments, a reduction in the burst mode time period reduces upstream bandwidth in an architecture such as PON 100, shown in FIG. 1, that includes the ONU. As a result of de-multiplexer filter characteristics, red-shift in a transmission from the ONU causes upstream channel loss to vary with burst length. To compensate for the red-shift, a DBR laser fine tuning can be employed according to embodiments of ONU 300, disclosed above in FIG. 3, to cause the laser wavelength to blue-shift. Such a blue-shift compensates for the red-shift and results in a net shift of zero in an ONU output transmission.

Figure 11:
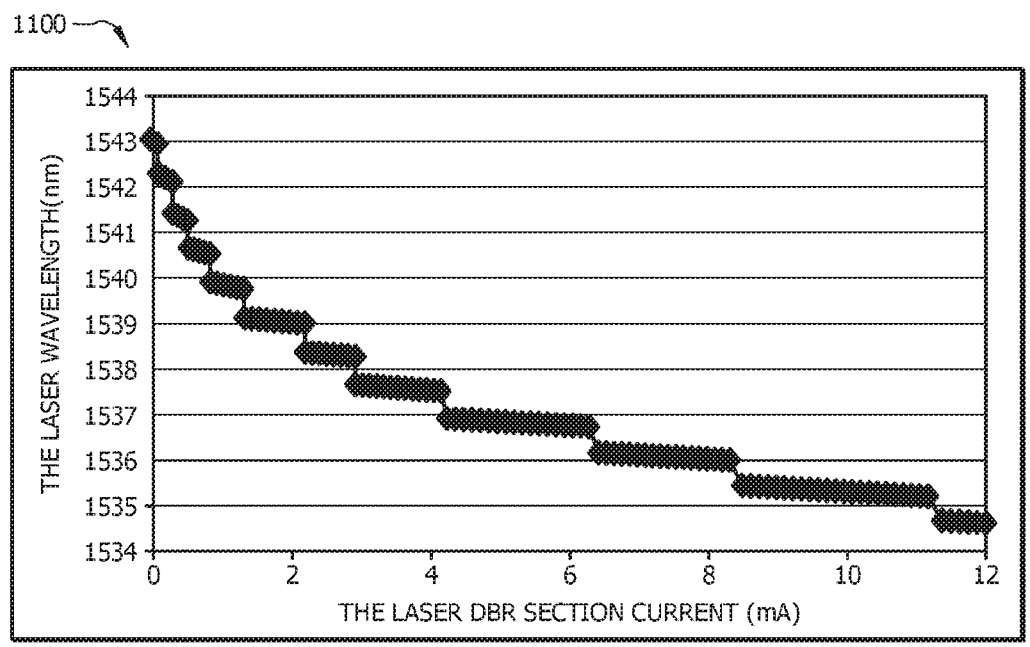
FIG. 11 is a graph of DBR tunable laser section tuning current versus wavelength.

FIG. 11 is a graph 1100 of DBR tunable laser DBR section current in milliamps (mA) versus wavelength in nm. In some embodiments, the results of FIG. 11 are obtainable through implementation of a system for compensating for wavelength red-shift caused by increased temperature, for example, a red-shift in the output of DBR laser 330 in ONU 300 and/or in a Tx/Rx 220 of network element 200. As DBR section current increases and a wavelength of the DBR laser experiences a blue-shift, the DBR laser hops one or more times from a first mode to a second mode. Each wavelength mode hop is about 0.7 nm, and is determined by the particular design of the DBR laser being utilized. As a result of the mode hops in the wavelength, the wavelength does not provide continuous tuning for a DBR laser.

Figure 12:
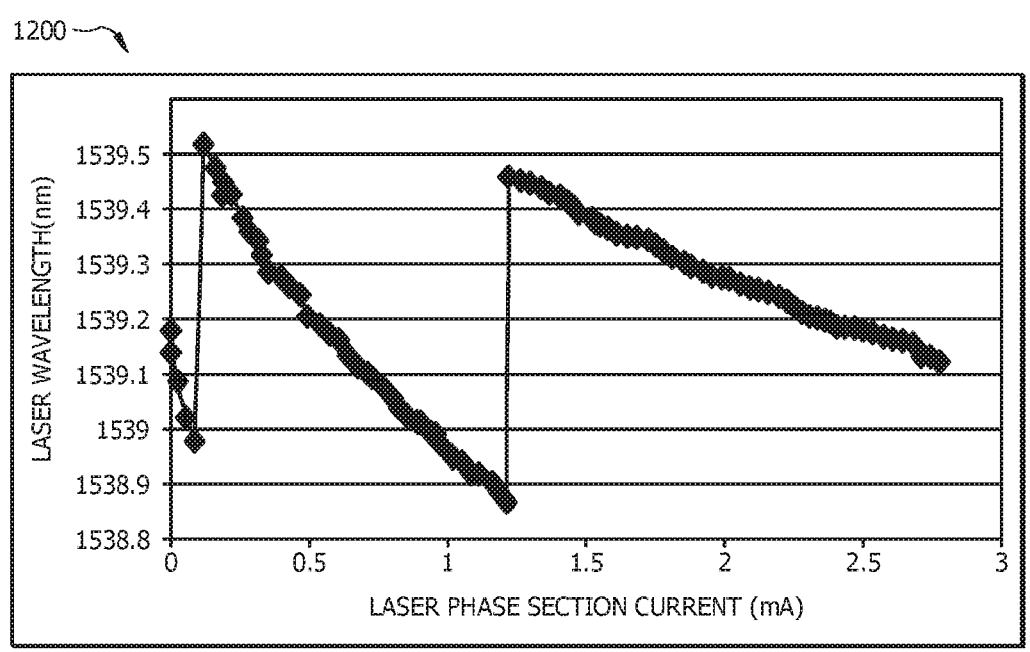
FIG. 12 is a graph of laser phase section tuning current versus wavelength.

FIG. 12 is a graph 1200 of laser phase fine tuning current versus wavelength. In some embodiments, the results of FIG. 12 are obtainable through implementation of a system for compensating for wavelength red-shift caused by increased temperature, such as, for example, a red-shift in the output of DBR laser 330 in ONU 300, both shown in FIG. 3. As laser phase section current increases, a wavelength of the DBR laser experiences a blue-shift. The blue-shift of the wavelength comprises a tuning curve capable of continuously tuning the DBR laser. As shown in FIG. 12, the wavelength of the DBR laser changes cyclically as laser phase fine tuning current increases.

In order to stabilize the DBR laser wavelength despite temperature change, the DBR laser gain section may be biased at some calculated value which may compensate for laser chip temperature increasing and/or decreasing for a particular application case. For example, when a DBR laser experiences a red-shift due to temperature increases, such as the red-shift illustrated in FIG. 8, injection current corresponding to FIG. 11 and FIG. 12, respectively, are provided to the DBR laser gain section to cancel the red-shift with a blue-shift, resulting in a net wavelength shift substantially close to zero.

Figure 13:
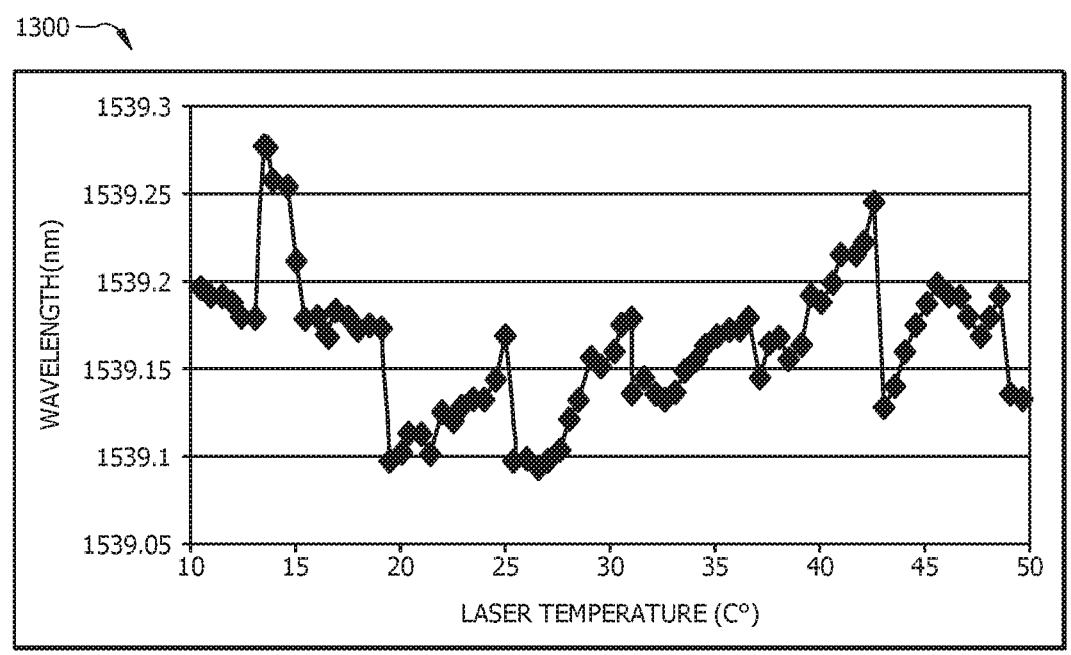
FIG. 13 is a graph of laser temperature associated with an ONU employing DBR laser wavelength stabilization.

FIG. 13 is a graph 1300 of laser temperature associated with an ONU, such as ONU 300, shown in FIG. 3, employing DBR laser wavelength stabilization by applying a blue-shift bias to a DBR tuning section. A DBR laser utilizing the laser phase fine tuning of the present disclosure stabilizes a wavelength to within about ±0.1 nm of an optimal value for a laser diode changing from 10 C.° to 50 C.°. As shown in FIG. 13, a 2.5 Gigahertz (GHz) modulation for DBR laser wavelength stabilization at an ONU is measured. For varying burst mode time periods, blue-shift compensation in the DBR laser varies correspondingly (e.g., a longer burst mode time period results in a greater laser diode temperature increases and red-shift, thereby requiring a greater blue-shift). In some embodiments the blue-shift compensation is referred to as laser phase fine tuning, and has a rapid response rate (e.g., about 10 nanoseconds (ns)). At small temperature changes (e.g., an about 1 C.° to about 0.5 C.° temperature change), wavelength stabilization error is less than 0.01 nm. At larger temperature changes (e.g., about 40 C.°) wavelength stabilization error is improved through the use of a high resolution current source.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A method implemented in a passive optical network (PON) comprising:
transmitting an optical signal in the PON via a laser transmitter utilizing time and wavelength division multiplexing (TWDM); and
dynamically compensating for a red-shift in a wavelength of the optical signal by introducing a blue-shift wavelength bias to a phase section of the laser transmitter,
wherein the red-shift is associated with an increase in temperature of the laser transmitter,
wherein the increase is associated with a duration of an optical signal burst,
wherein the blue-shift wavelength bias is a phase current defined by an equation $I_p = f(t)$, and
wherein $I_p$ is the phase current, f(t) is a time-dependent function, and t is a time and ranges from 0 to an end of a burst mode time period.

2. The method of claim 1, wherein dynamically compensating for the red-shift comprises:
obtaining optical transmission power information based on real-time measurement of photo-current across a photodiode of the laser transmitter;
estimating a burst mode time period according to received timeslot instructions; and
calculating an injection current for use as the blue-shift wavelength bias to compensate for the red-shift based on the burst mode time period and the optical transmission power information.

3. The method of claim 2, wherein calculating the injection current for use as the blue-shift wavelength bias is performed by an optical network unit (ONU) according to a media access controller (MAC) instruction.

4. A method implemented in a passive optical network (PON) comprising:
transmitting an optical signal in the PON via a laser transmitter utilizing time and wavelength division multiplexing (TWDM); and
dynamically compensating for a red-shift in a wavelength of the optical signal associated with an increase in temperature of the laser transmitter associated with a duration of an optical signal burst,
wherein compensation is performed by introducing a blue-shift wavelength bias to the laser transmitter, and
wherein dynamically compensating for the red-shift comprises:
obtaining optical transmission power information based on measurement of photo-current across a photodiode of the laser transmitter;
estimating a burst mode time period according to received timeslot instructions;
calculating an injection current for use as the blue-shift wavelength bias to compensate for the red-shift based on the burst mode time period and the optical transmission power information;
receiving an electrical data signal associated with the optical signal, the electrical data signal comprising a data signal current;
combining the data signal current with the injection current to create a combined current to dynamically bias the laser transmitter to compensate for the red-shift;
converting the combined current into the optical signal via the laser transmitter, and
transmitting the optical signal via the laser transmitter.

5. The method of claim 4, wherein obtaining the optical transmission power information comprises:
receiving a real-tune measurement of laser optical power monitor photodiode current represented as a digital value; and
calculating the optical transmission power information from the real-time measurement.

6. The method of claim 3, wherein the laser transmitter comprises a distributed Bragg reflector (DBR).

7. The method of claim 6, further comprising applying a current to the DBR to provide wide-range wavelength tuning that complements the blue-shift wavelength bias.

8. The method of claim 3, wherein the red-shift is proportional to an optical signal burst duration and an optical output power level.

9. The method of claim 3, wherein the injection current varies proportionally to a transmission burst length.

10. The method of claim 3, wherein the blue-shift wavelength bias approximately cancels the red-shift such that output of the laser transmitter is within 0.1 nanometers (nm) of a preferred output value.

11. An optical component comprising:
a laser transmitter comprising a phase section and configured to transmit an optical signal in a passive optical network (PON) utilizing time and wavelength division multiplexing (TWDM); and
a media access controller (MAC) coupled to the laser transmitter, wherein the MAC is configured to dynamically compensate for a red-shift in a wavelength of the optical signal by:
obtaining optical transmission power information based on measurement of a photo-current across a photodiode of the laser transmitter,
estimating a burst mode time period according to received timeslot instructions,
calculating an injection current for use as a blue-shift wavelength bias to compensate for the red-shift based on the burst mode time period and the optical transmission power information, and
introducing the blue-shift wavelength bias to the phase section,
wherein the red-shift is associated with an increase in temperature of the laser transmitter, and
wherein the increase is associated with a duration of an optical signal burst.

12. The optical component of claim 11, further comprising a receiver configured to receive an electrical data signal associated with the optical signal, wherein the electrical data signal comprises a data signal current, and wherein the MAC is further configured to further dynamically compensate for the red-shift by:
employing a bias controller to combine the data signal current with the injection current to create a combined current to dynamically bias the phase section to compensate for the red-shift;
converting the combined current into the optical signal; and
transmitting the optical signal via the laser transmitter.

13. The optical component of claim 12, wherein obtaining the optical transmission power information comprises:
receiving a real-time measurement of laser optical power monitor photodiode current represented as a digital value; and
calculating the optical transmission power information from the real-time measurement.

14. The optical component of claim 12, wherein the laser transmitter is a Distributed Bragg reflector (DBR).

15. The optical component of claim 14, wherein the DBR is configured to receive a current to implement wide-range wavelength tuning that complements the blue-shift wavelength bias.

16. The optical component of claim 12, wherein the injection current varies proportionally to a transmission burst length.

17. The optical component of claim 12, wherein the blue-shift wavelength bias approximately cancels the red-shift such that output of the laser transmitter is within 0.1 nanometers (nm) of a preferred output value.

18. The optical component of claim 12, wherein the optical component is an optical network unit (ONU) configured to couple to a time and wavelength division multiplexed passive optical network (TWDM-PON).

19. The optical component of claim 12, wherein the optical component is an optical network terminal (ONT) configured to couple to a time and wavelength division multiplexed passive optical network (TWDM-PON).

20. The method of claim 1, wherein the blue-shift wavelength bias is independent of a duty cycle.

21. The method of claim 1, wherein the dynamically compensating occurs during the transmitting.

22. The optical component of claim 11, further comprising a receiver configured to receive an electrical data signal associated with the optical signal, wherein the electrical data signal comprises a data signal voltage, and wherein the MAC is further configured to further dynamically compensate for the red-shift by:
employing a bias controller to create a combined signal based on the data signal voltage and the injection current to dynamically bias the phase section to compensate for the red-shift;
converting the combined signal into the optical signal; and
transmitting the optical signal via the laser transmitter.

* * * * *